US010325133B2

(12) United States Patent
Ghavanini et al.

(10) Patent No.: US 10,325,133 B2
(45) Date of Patent: Jun. 18, 2019

(54) CAPACITIVE FINGERPRINT SENSING DEVICE COMPRISING DISPLAY FUNCTIONALITY

(71) Applicant: Fingerprint Cards AB, Göteborg (SE)

(72) Inventors: Farzan Ghavanini, Göteborg (SE); Pontus Jägemalm, Lerum (SE)

(73) Assignee: Fingerprint Cards AB, Göteborg (SE)

( * ) Notice: Subject to any disclaimer, the term of this patent is extended or adjusted under 35 U.S.C. 154(b) by 98 days.

(21) Appl. No.: 15/807,139

(22) Filed: Nov. 8, 2017

(65) Prior Publication Data
US 2018/0173922 A1 Jun. 21, 2018

(30) Foreign Application Priority Data
Dec. 19, 2016 (SE) ..................... 16516783

(51) Int. Cl.
*G06K 9/28* (2006.01)
*G06K 9/00* (2006.01)
(Continued)

(52) U.S. Cl.
CPC .......... *G06K 9/0002* (2013.01); *G06F 3/044* (2013.01); *G06F 3/0412* (2013.01);
(Continued)

(58) Field of Classification Search
CPC ............. G06K 9/0002; G06K 9/00006–0012
See application file for complete search history.

(56) References Cited

U.S. PATENT DOCUMENTS

2003/0174870 A1   9/2003  Kim et al.
2010/0110041 A1   5/2010  Jang
(Continued)

FOREIGN PATENT DOCUMENTS

WO    2016036179 A1    3/2016

OTHER PUBLICATIONS

Kim et al., "High-SNR Capacitive Multi-Touch Sensing Technique for AMOLED Display Panels", IEEE Sensors Journal, vol. 16, No. 4, Feb. 15, 2016, pp. 859-860. (Year: 2016).*
(Continued)

Primary Examiner — Brian Werner
(74) Attorney, Agent, or Firm — RMCK Law Group, PLC

(57) ABSTRACT

A capacitive fingerprint sensing device for sensing a fingerprint pattern of a finger can comprise a plurality of sensing elements. Each sensing element comprises a protective dielectric top layer to be touched by the finger; a first electrode comprising an optically transparent electrically conductive sensing structure arranged underneath the top layer; fingerprint sensing circuitry connected to the first electrode and configured to provide an analog sensing signal indicative of a distance between the finger and the sensing structure, a second electrode arranged underneath the first electrode; an organic light emitting layer arranged between the first and second electrodes; display element control circuitry connected to the second electrode and configured to control a display element comprising the first and second electrodes and the organic light emitting layer; and a switching mechanism configured to switch the sensing element between a fingerprint sensing mode and a display mode.

16 Claims, 8 Drawing Sheets

(51) Int. Cl.
*G06F 3/041* (2006.01)
*H01L 27/32* (2006.01)
*G06F 3/044* (2006.01)

(52) U.S. Cl.
CPC .......... *G06F 3/0416* (2013.01); *H01L 27/323* (2013.01); *G06F 2203/04112* (2013.01)

(56) References Cited

U.S. PATENT DOCUMENTS

| | | |
|---|---|---|
| 2014/0036168 A1 | 2/2014 | Ludwig |
| 2015/0109214 A1 | 4/2015 | Shi et al. |
| 2015/0254491 A1 | 9/2015 | Mo et al. |
| 2015/0331508 A1* | 11/2015 | Nho ............... G06F 3/0421 345/173 |
| 2016/0350571 A1 | 12/2016 | Han et al. |
| 2018/0130857 A1* | 5/2018 | Lee ............... H01L 27/3234 |
| 2018/0151639 A1* | 5/2018 | Luo ............... G06K 9/00033 |

OTHER PUBLICATIONS

Zaxariadis et al., "Single-touch and multi-touch LED screen", Department of Electronic Computer Systems, Technological Educational Institute of Piraeus, 250 P. Ralli & Thivon, 12244 Egaleo, Greece, uploaded to ResearchGate on Jan. 22, 2016, cover page + pp. 1-6. (Year: 2016).*

Kim, et al., "A Highly Sensitive Capacitive Touch Sensor Integrated on a Thin-Film-Encapsulated Active-Matrix OLED for Ultrathin Displays", IEEE Transactions on Electron Devices, vol. 58, No. 10, pp. 3609-3615, Oct. 2011.

Ma et al., "On-Display Transparent Half-Diamond Pattern Capacitive Fingerprint Sensor Compatible With AMOLED Display", IEEE Sensors Journal, vol. 16, No. 22, pp. 8124-8131, Nov. 15, 2016.

Swedish Search Report for Swedish Application No. 1651678-3 dated Jul. 21, 2017, 3 pages.

* cited by examiner

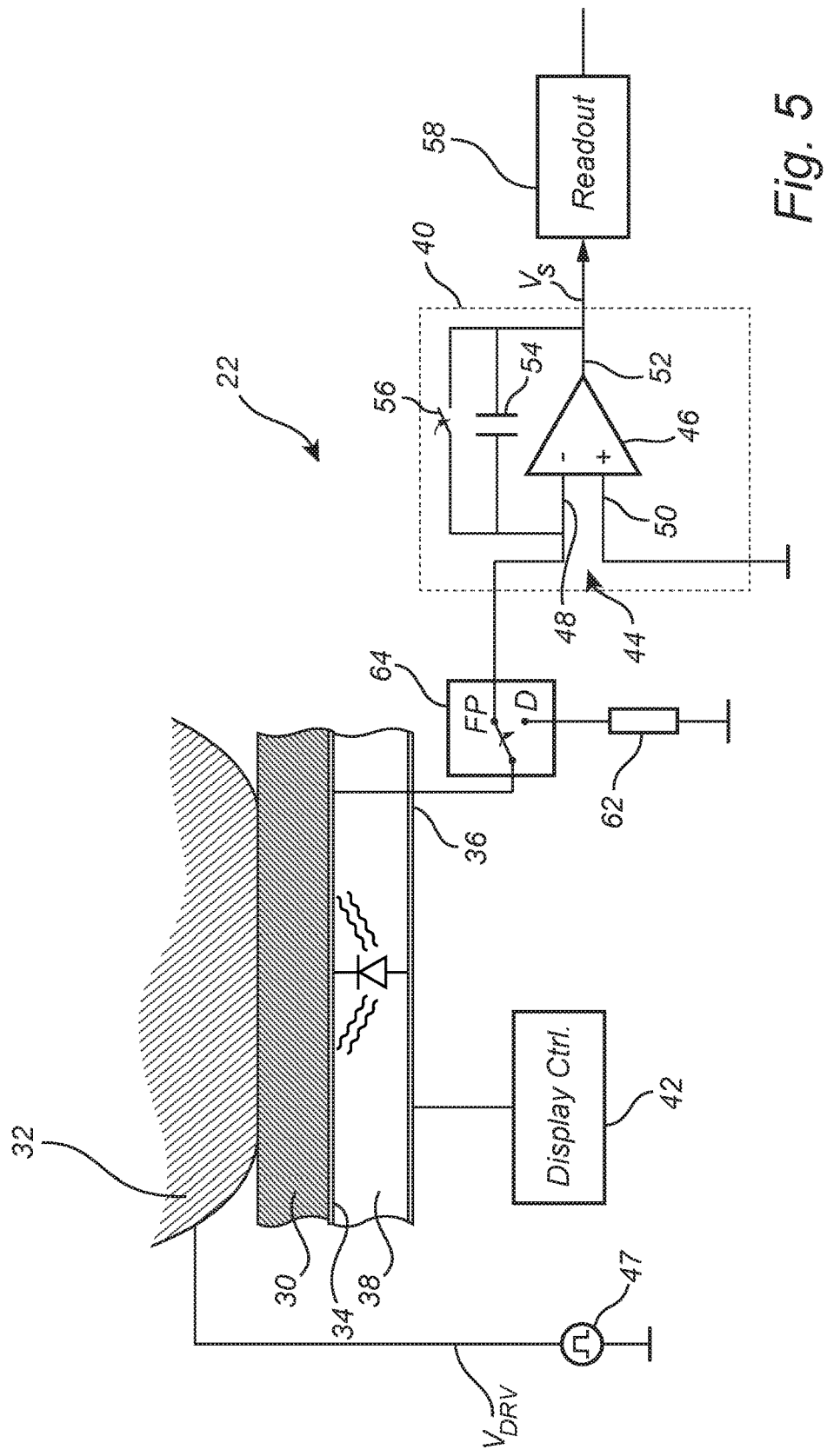

CAPACITIVE FINGERPRINT SENSING DEVICE COMPRISING DISPLAY FUNCTIONALITY

CROSS REFERENCE TO RELATED APPLICATIONS

This application claims priority to Sweden Application No. 1651678-3 filed on Dec. 19, 2016, the disclosure of which is incorporated herein by reference in its entirety.

FIELD OF THE INVENTION

The present invention relates to a capacitive fingerprint sensing device comprising a display element integrated in the capacitive sensing element

BACKGROUND OF THE INVENTION

The integration of a fingerprint sensor in a display panel is very desirable for the mobile fingerprint sensing industry. A conventional approach to address this challenge has been to integrate a fingerprint sensor in a common display panel such as an LCD panel or an OLED panel. In this approach, the priority is given to display properties and visual quality. Therefore, the final desired product is a display panel which is capable of detecting a fingerprint.

In a display having fingerprint sensing capabilities, the pixels in the display are also acting as capacitive sensing elements. A touch display is often based on TFT-technology implemented in ITO, making the circuitry essentially transparent. However, the TFT-technology is limiting in that a display typically comprises 1-6 transistors per pixel, whereas a fingerprint sensor typically requires significantly more transistors, which is difficult to achieve for a TFT display.

Accordingly, circuitry for high resolution capacitive fingerprint sensing can not easily be implemented in TFT technology. In particular, for sensing under glass, a higher sensitivity of the fingerprint sensor is required due to the increased distance between the finger and the sensor, which in turn requires additional circuitry.

Accordingly, there is a need for an improved fingerprint sensing device having integrated display functionality.

SUMMARY

In view of above-mentioned and other drawbacks of the prior art, it is an object of the present invention to provide a high resolution fingerprint sensing device which also comprises display functionality.

According to a first aspect of the invention, there is provided a capacitive fingerprint sensing device for sensing a fingerprint pattern of a finger, said capacitive fingerprint sensing device comprising a plurality of sensing elements. Each sensing element comprises a protective dielectric top layer to be touched by said finger; a first electrode comprising an optically transparent electrically conductive sensing structure arranged underneath said top layer; fingerprint sensing circuitry connected to said first electrode and configured to provide an analog sensing signal indicative of a distance between said finger and said sensing structure, a second electrode arranged underneath said first electrode; an organic light emitting layer arranged between said first and second electrodes; display element control circuitry connected to said second electrode and configured to control a display element comprising said first and second electrodes and said organic light emitting layer; and a switching mechanism configured to switch said sensing element between a fingerprint sensing mode and a display mode.

The sensing element can in the present context be considered to represent a pixel, i.e. an individually controllable element which corresponds to either a display pixel or a fingerprint sensing pixel depending on the selected mode of the sensing element. The term display element may also be used.

The fingerprint sensing element is based on a capacitive coupling between a finger placed on a sensing surface, i.e. an external surface, and the first electrode. In embodiments described herein, the sensing surface is the outer surface of the protective dielectric top layer. The protective dielectric top layer typically comprises a dielectric protective plate in order to provide a resilient mechanical protection as well as good capacitive coupling between a finger placed on the plate and the sensing elements of the sensing device. In particular, the protective plate may advantageously comprise a glass or ceramic material, such as a chemically strengthened glass, $ZrO2$ or sapphire. The above materials all provide advantageous properties in that they are hard and resistant to wear and tear, and in that they are dielectric thereby providing a good capacitive coupling. However, other suitable materials may also be used.

Moreover, the protective dielectric top layer is at least partially optically transparent in order to allow emission of light generated in the light emitting layer. The resulting effect is that light is emitted from the sensing surface of the fingerprint sensing device. Preferably, the protective dielectric top layer is fully transparent to enhance light extraction from the light emitting layer.

An organic light emitting layer, forming an organic light emitting diode (OLED) along with the first and second electrode, is advantageously used due to its high performance and since it is possible to integrate with fingerprint sensing functionality as will be discussed in the following. The OLED layer may in turn comprise a plurality of sublayers to achieve the desirable light emission properties. A typical OLED-stack may for example comprise, in the direction from anode to cathode, anode, hole injection layer, hole transport layer, emissive layer, blocking layer, electron transport layer and finally the cathode. However, various available OLED-configurations are well known to the skilled person and will not be discussed in further detail in the present disclosure.

The present invention is based on the realization that a fingerprint sensing device comprising sensing elements according to the described structure can be operated in two different modes, namely a display mode and a fingerprint sensing mode. In particular, the described sensing device is capable of providing display functionality to display videos and images without reducing the sensitivity of the fingerprint sensing. In the present context, the emphasis of the device is on the fingerprint sensing properties and fingerprint image quality and not on the visual performance. Accordingly, the described device is not primarily intended to replace a display panel. Instead, the device is to be seen as a fingerprint sensor which is capable of conveying visual information in the form of videos and images to be used for notifications and visual guidance. However, the described technology could equally well be implemented as a display panel.

According to one embodiment of the invention, the switching mechanism comprises a diode formed by the first and second electrode and the organic light emitting layer located therebetween, and wherein the diode is configured to be forward biased in the display mode such that a current flows from the second electrode to the first electrode through the organic light emitting layer, and to be reverse biased or sub-threshold biased in the fingerprint sensing mode such that the current flowing between the second electrode and the first electrode is sufficiently low so as to allow fingerprint sensing.

Thereby, the switching mechanism functionality is integrated into the sensing element itself in the form of the diode. In principle, there is thus no need for a dedicated switch element, which simplifies the construction of the sensing element. Switching between display mode and fingerprint sensing mode is thereby controlled by controlling the bias on the first and the second electrodes. In the fingerprint sensing mode, it is desirable to minimize the current flowing through the diode. Preferably, the current is as close to zero as possible. Therefore, the diode is not forward biased in the display mode. It may still be possible to accurately capture a fingerprint image also with a certain amount of current flowing through the diode. However, the biasing must be controlled such that the current flowing through the diode in the fingerprint sensing mode is not so large so that it significantly degrades the fingerprint sensing functionality.

A bias is herein defined as a potential difference between the two electrodes. Moreover, the diode can be reverse biased, forward biased, or subthreshold biased. The diode is considered to be forward biased when a potential of the second electrode is higher than a potential of the first electrode, and when the potential difference is higher than the diode threshold voltage. The diode is considered to be subthreshold biased when the diode is forward biased but the potential difference of the two electrodes is lower than the diode threshold voltage. The sub-threshold bias region also includes zero-bias where a potential of the first electrode is practically equal to a potential of the second electrode. The diode is considered to be reverse biased when a potential of the first electrode is higher than a potential of the second electrode.

In practice, it is primarily the bias of the second electrode which is controlled by the display control circuitry to control the bias of the diode. The display control circuitry may also comprise current control circuitry which controls the amplitude of the current going through the diode, thereby controlling the intensity of the emitted light. If the first electrode is grounded, the bias potential is controlled solely by the display control circuitry.

According to one embodiment of the invention, the fingerprint sensing circuitry may comprise an operational amplifier having a first input connected to the first electrode of the sensing structure, a second input connected to a reference potential, and an output; a feedback capacitor connected between the first input and the output; and reset circuitry comprising a reset switch arranged in parallel with the feedback capacitor for allowing controllable discharge of the feedback capacitor, wherein said reset switch is configured to be open at least a portion of the time when said fingerprint sensor is in said fingerprint sensing mode and to be permanently closed in said display mode.

According to one embodiment of the invention, the device may further comprise a reference load connected between the output of the operational amplifier and ground. When the light emitting diode is forward biased, the current flowing from the second to the first electrode through the light emitting layer must subsequently be dissipated somewhere. The purpose of the reference load is thereby to provide a current path from the first electrode to ground such that a current flowing through the diode in display mode may be dissipated. Accordingly, the impedance of the reference load is selected such that it is significantly lower than the input impedance of the operational amplifier and the input impedance of the readout circuitry connected to the output of the operational amplifier. However, it should be noted that in principle the current could be dissipated in the operational amplifier and/or in the readout circuitry as long as the current is not so high that it would damage either circuit.

According to one embodiment of the invention, the switching mechanism may further comprise an output switch arranged after the output of the operational amplifier, to, in the display mode, connect the output of the operational amplifier to a reference load, and in the fingerprint sensing mode, connect the output of said operational amplifier to fingerprint readout circuitry.

Since it may be desirable to avoid that the current is dissipated in the readout circuitry or in the operational amplifier, which could possibly damage the circuitry, an output switch can be used such that the current can be dissipated in the reference load, thereby preventing any negative effects in the readout circuitry. The output switch is thus operating according to the mode of operation such that the current flowing through the diode in the display mode can pass via the reset switch and the output switch to be dissipated in the reference load.

According to one embodiment of the invention, the switching mechanism may comprise an input switch arranged between the first electrode and the first input of the operational amplifier, the input switch being configured to, in the display mode, connect the first electrode to a reference load, and in the fingerprint sensing mode, connect the first electrode to the input of the operational amplifier. Thereby, the current flowing through the light emitting layer in the display mode can be directed to the reference load to be dissipated. In the fingerprint sensing mode, the input switch is connecting the first electrode to the operational amplifier to enable fingerprint readout.

According to one embodiment of the invention the reference potential may be a ground potential. The second input of the operational amplifier will thereby be grounded, meaning that the first electrode is virtually grounded. By using a ground reference as the reference potential, the operation of the light emitting layer can be controlled solely by controlling the potential on the second electrode. Hereby, the display element control circuitry can control the bias over the diode in the display mode based on that the first electrode is at ground potential.

According to one embodiment of the invention the first electrode may advantageously comprise indium tin oxide, ITO. ITO is both transparent and electrically conductive and is thus well suited as electrode material. Moreover, ITO is commonly used in microelectronic manufacturing methods and its properties are thereby well known, making it easy to integrate in already existing manufacturing processes.

According to one embodiment of the invention, the fingerprint sensing circuitry and the display element control circuitry may be provided in the form of CMOS-circuitry in a Si substrate. Hereby, the required circuit complexity for both the display element control circuitry and more so for the fingerprint sensing circuitry, can be provided. An additional advantage is that well known OLED-on-silicon technology can be used to form the light emitting layer, thereby facilitating fabrication of the fingerprint sensing device.

According to one embodiment of the invention the plurality of sensing elements are arranged in an array, and the organic light emitting layer is homogeneous in an xy-plane defined by said array, covering all of said second electrodes in said array. In the present context, that the light emitting layer is homogeneous in the xy-plane means that there are no defined pixels in the light emitting layer itself. Instead, the pixels, i.e. the sensing elements/display elements, are defined by the first and second electrodes which are individually addressable, thereby providing a display having a pixel size corresponding to the size of the first electrode. It should be noted that the light emitting layer still may comprise a plurality of sublayers in a z-direction perpendicular to the electrodes, i.e. in a direction between the first and second electrode.

According to one embodiment of the invention, the plurality of sensing elements are arranged in an array, and the organic light emitting layer comprises individual light emitting areas corresponding to locations of said first and second electrodes. Thereby, the pixel size is defined both by the electrodes and the light emitting layer.

According to one embodiment of the invention, the sensing device may further comprise drive signal circuitry configured to, in the fingerprint sensing mode, provide a time varying potential between a finger placed on the sensing surface and the first electrode, wherein the display element control circuitry is configured to adapt a bias over the diode based on the drive signal such that the diode is reverse biased or sub-threshold biased, i.e. not forward biased. In the fingerprint sensing mode, it is common to form a time varying potential between the finger and the sensing electrode by means of a time varying drive signal. The drive signal may be applied directly to the finger using an electrically conductive bezel in the vicinity of the fingerprint sensor. The drive signal may also be provided to the second input of the operational amplifier, and thereby to the first electrode, or the drive signal may be provided to a reference ground potential of the sensing element such that the sensing element ground level is varying according to the drive signal. A result of the time varying potential is that the potential of the first electrode will vary, and regardless of how the time varying potential is created it is important that the diode is not forward biased in the fingerprint sensing mode. Thereby, the potential on the second electrode is controlled to maintain the bias over the light emitting diode in the sub-threshold or the reverse bias region. This may for example be ensured by lowering the potential of the second electrode to a level that the light emitting diode is never forward biased by any feasible potential swing at the first electrode resulting from the drive signal. Alternatively, a time varying potential may be applied to the second electrode corresponding to the time varying potential experienced by the first electrode.

According to a second aspect of the invention, there is provided a method of controlling a capacitive fingerprint sensing device for sensing a fingerprint pattern of a finger, the capacitive fingerprint sensing device comprising a plurality of sensing elements. Each sensing element comprising: a protective dielectric top layer to be touched by the finger; a first electrode comprising an optically transparent electrically conductive sensing structure arranged underneath the top layer; fingerprint sensing circuitry connected to the first electrode and configured to provide an analog sensing signal indicative of a distance between the finger and the sensing structure; a second electrode arranged underneath the first electrode; an organic light emitting layer arranged between the first and second electrodes; display element control circuitry connected to the second electrode and configured to control a display element comprising the first and second electrodes and the organic light emitting layer; and a switching mechanism configured to switch the sensing element between a fingerprint sensing mode and a display mode. The method comprises controlling the switching mechanism to switch the fingerprint sensing device between a fingerprint sensing mode and a display mode.

According to one embodiment of the invention the method may further comprise, in the display mode, applying a forward bias over a diode comprising the first and the second electrodes and the organic light emitting layer such that a current flows from the second electrode to the first electrode through the organic light emitting layer, and, in the fingerprint sensing mode, applying a reverse bias or a sub-threshold bias over the diode such that the current flowing between the second electrode and the first electrode is sufficiently low so as to allow fingerprint sensing.

According to one embodiment of the invention the method may further comprise, in the fingerprint sensing mode, providing a drive signal for providing a change in potential difference between the finger and the sensing structure, and adapting a bias over the diode based on the drive signal such that the diode is reverse biased or sub-threshold biased.

According to one embodiment of the invention, adapting a bias over the diode based on the drive signal may comprise applying a potential to the first electrode and/or to the second electrode corresponding to the drive signal, to minimize the current between the first and second electrodes.

According to one embodiment of the invention, adapting a bias over the diode based on the drive signal may comprise applying a potential to the first electrode and/or to the second electrode such that the potential is the same on each of the first and second electrodes. Thereby, the current through the light emitting layer can be minimized in the fingerprint sensing mode. As an example, the potential on the second can be controlled by the display control circuitry, and the potential on the first electrode can be measured and fed back to the display control circuit, thereby making it possible to control the bias over the diode to be zero.

Effects and features of the second aspect of the invention are largely analogous to those described above in connection with the first aspect of the invention.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

These and other aspects of the present invention will now be described in more detail, with reference to the appended drawings showing an example embodiment of the invention, wherein:

FIG. 5 schematically illustrates a sensing element of a fingerprint sensor according to embodiments of the invention;

DETAILED DESCRIPTION OF EXAMPLE EMBODIMENTS

In the present detailed description, various embodiments of the system and method according to the present invention are mainly described with reference to a capacitive fingerprint sensing device arranged in a smartphone. However, it should be noted that the present invention is applicable in a wide range of applications.

Figure 1:
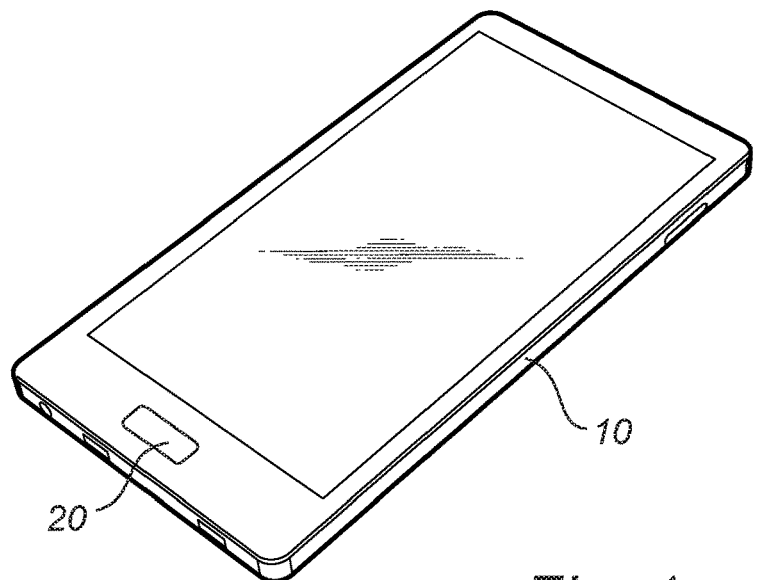
FIG. 1 schematically illustrates an electronic device comprising a fingerprint sensor according to embodiments of the invention.

FIG. 1 schematically illustrates a smartphone 10 comprising a fingerprint sensing device 20 according to an example embodiment of the present invention. The fingerprint sensing device 20 may, for example, be used for unlocking the smartphone 10 and/or for authorizing transactions carried out using the smartphone, etc. A fingerprint sensing device according to various embodiments of the invention may also be used in other devices, such as tablet computers, laptops, smartcards or other types of consumer electronics. The described fingerprint sensing device may also be used in applications such as smartcards, vehicles etc.

Figure 2:
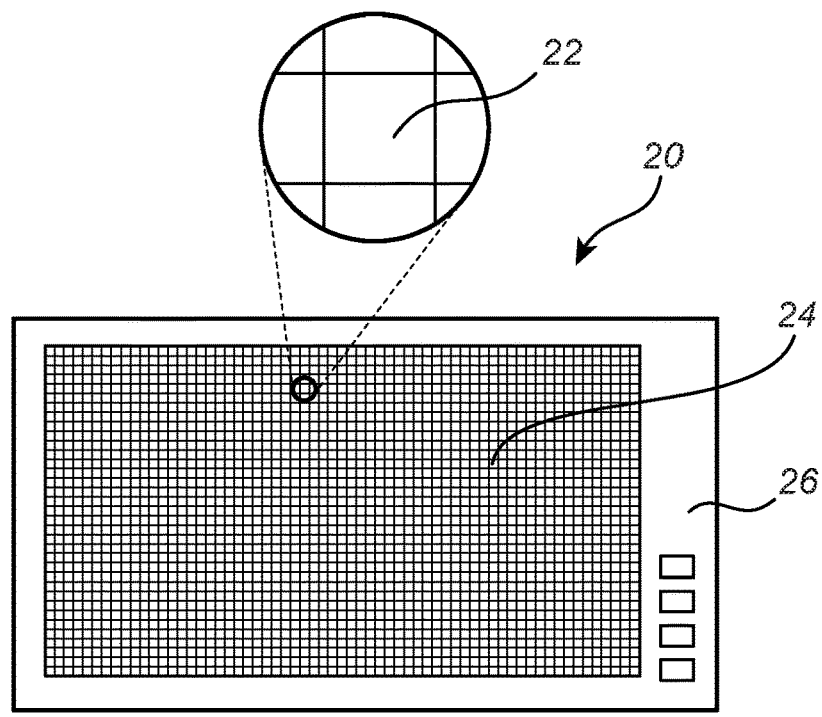
FIG. 2 schematically illustrates a fingerprint sensor according to embodiments of the invention.

FIG. 2 schematically shows the fingerprint sensing device 20 comprised in the smartphone 10 in FIG. 1. As can be seen in FIG. 2, the fingerprint sensing device 20 comprises a plurality of sensing elements 22 arranged in a sensor array 24. The fingerprint sensing device 20 further comprises connection pads 26 forming a power supply interface and a communication interface. The sensor array 24 comprises a large number of sensing elements 22, each being controllable to sense a distance between an electrically conductive sensing structure comprised in the sensing element and the surface of a finger contacting the top surface of the sensing device 20.

Figure 3A:
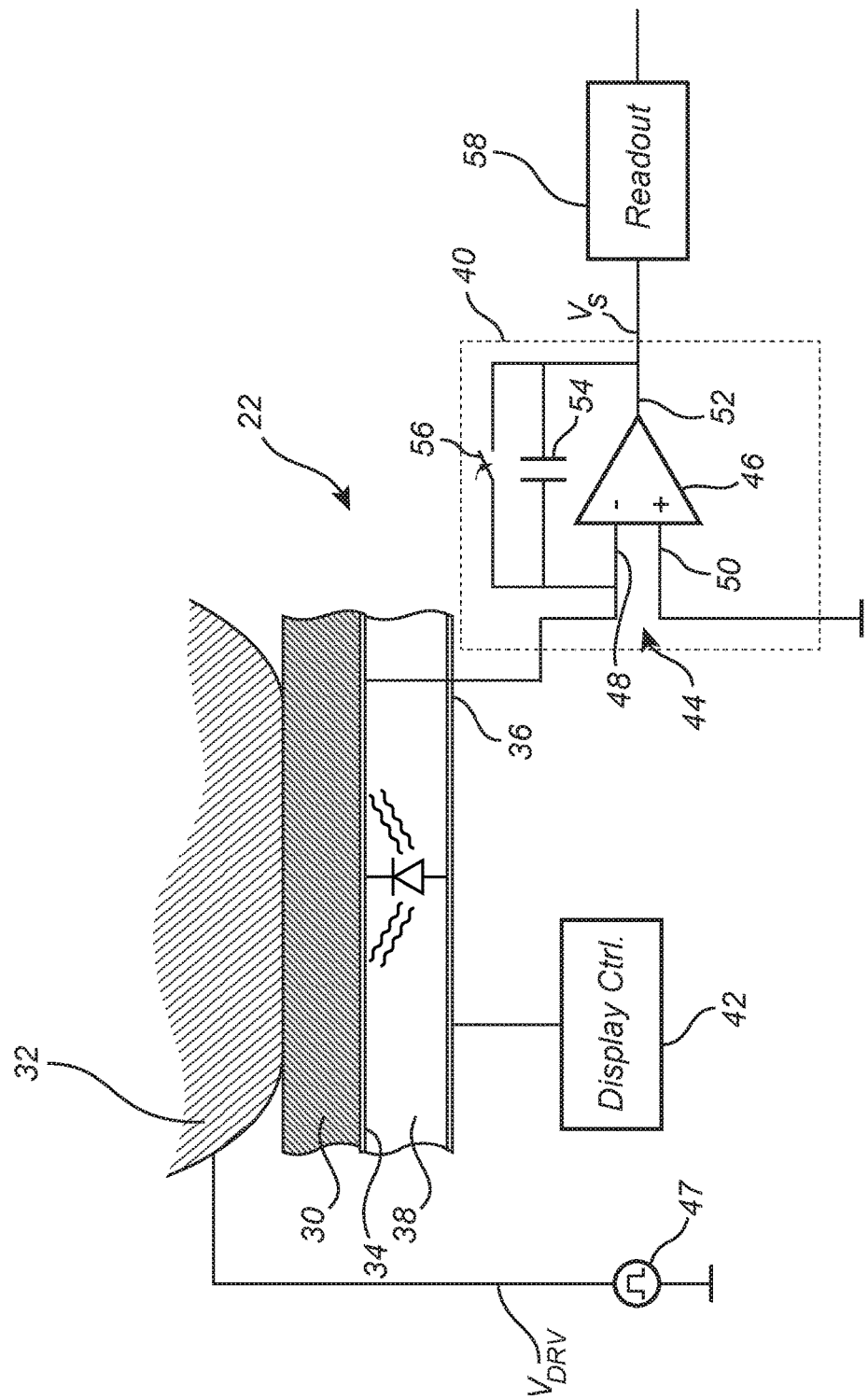
FIGS. 3A-B schematically illustrate sensing elements of a fingerprint sensor according to embodiments of the invention.

FIG. 3A schematically illustrates the capacitive fingerprint sensing device 20, and in particular one sensing element 22 of the sensing device. Each sensing element comprises a protective dielectric top layer 30 to be touched by the finger 32, a first electrode 34 comprising an optically transparent and electrically conductive sensing structure arranged underneath the top layer 30, a second electrode 36 arranged underneath the first electrode and an organic light emitting layer 38 arranged between the first and second electrodes, 34, 36.

It should be noted that even though the organic light emitting layer 38 is illustrated herein as one layer, it may consist of plurality of layers including but not limited to electron transport layer, hole transport layer, electron blocking layer, hole blocking layer, and emitting layer.

It should also be noted that even though the dielectric top layer 30 is illustrated herein as one layer, the top layer may consist of plurality of layers. In addition to a protective dielectric layer, such as a glass or quartz plate, the top layer may also comprise one or more ink layers, adhesive layers etc.

Each sensing element 22 further comprises fingerprint sensing circuitry 40 connected to the first electrode 34 and configured to provide an analog sensing signal indicative of a distance between the finger 32 and the sensing structure 34. The sensing element 22 further comprises display element control circuitry 42 connected to the second electrode 36 and configured to control a display element comprising said first and second electrodes 34, 36 and the organic light emitting layer 38. Accordingly, the display element is part of and comprised in the sensing element 22. Furthermore, the sensing element 22 comprises a switching mechanism configured to switch the sensing element 22 between a fingerprint sensing mode and a display mode.

The switching mechanism is here embodied by a diode structure formed by the first electrode 34, the second electrode 36 and the organic light emitting layer 38 arranged therebetween. The diode operation, i.e. the biasing mode of the diode, is primarily controlled by the display control circuitry 42 which is configured to control the potential of the second electrode 36. The bias over the diode will also depend on any potential applied to the first electrode 34. In the display mode, the diode is forward biased such that a controllable current flows between the second electrode 36 and the first electrode 34 through the organic light emitting layer 38, thereby stimulating light emission with the intensity of emitted light proportional to the amplitude of the electrical current. In the fingerprint sensing mode, a potential is applied to the second electrode 36 of the diode such that preferably no current flows between the second electrode 36 and the first electrode 34. Accordingly, the diode is reverse biased or sub-threshold biased, and the current flowing between the first and second electrodes, 34, 36 should be sufficiently small so as to not interfere with fingerprint sensing. The first electrode 34 may be referred to as the cathode of the light emitting diode and the second electrode 36 as the anode of the light emitting diode.

In general, it is desirable to minimize the current between the first and the second electrodes, 34, 36, in the fingerprint sensing mode by biasing the diode comprising the OLED layer 38 in the subthreshold region or in the reverse bias region. Thereby, the resistance seen from the first electrode 34 will be lower towards the fingerprint sensing circuitry 40 in comparison to the resistance towards the second electrode 36. Thereby, the current, or at least the majority of the current, will flow between the first electrode 34 and the fingerprint sensing circuitry 40, thereby enabling fingerprint sensing.

In the display mode, the intensity of light emitted from the light emitting layer 38 is controlled by controlling the current through the layer, where a higher current gives rise to a stronger emission. The current is in turn related to the forward voltage of the diode according to conventional diode characteristics. Many different implementations of diode biasing and control circuitry exist and are well known by the skilled person, and will as such not be discussed in detail herein.

The sensing circuitry 40 of the sensing element 22 further comprises a charge amplifier 44, and drive signal circuitry 47 for controlling and providing a drive signal $V_{DRV}$ to the finger as is schematically indicated in FIG. 3A. The drive signal circuitry 47 can for example comprise a controllable voltage source or a pulse generator. As further illustrated in FIG. 3A, a ridge of the finger 32 is located directly above the sensing structure 34 indicating the minimum distance between the finger 32 and the sensing structure 34, as defined by the thickness of the dielectric top layer 30.

The charge amplifier 44 comprises at least one amplifier stage, here schematically illustrated as an operational amplifier (op amp) 46 having a first input (negative input) 48 connected to the sensing structure 34, a second input (positive input) 50 connected to ground or to another reference potential, and an output 52. In addition, the charge amplifier 44 comprises a feedback capacitor 54 connected between the first input 48 and the output 52, and reset circuitry, here functionally illustrated as a switch 56, for allowing controllable discharge of the feedback capacitor 54. The charge amplifier 44 may be reset by operating the reset circuitry 56 to discharge the feedback capacitor 54. It should be noted that in the fingerprint sensing mode, the reset switch 56 is opened and closed during different stages of sampling, whereas in the display mode the reset switch 56 is permanently closed in order to bypass the feedback capacitor 54.

As is often the case for an op amp 46 in a negative feedback configuration, the voltage at the first input 48 follows the voltage at the second input 50. Depending on the particular amplifier configuration, the potential at the first input 48 may be substantially the same as the potential at the second input 50, or there may be a substantially fixed offset between the potential at the first input 48 and the potential at the second input 50. In the configuration of FIG. 3A, the first input 48 of the charge amplifier is virtually grounded. Thereby, the first electrode 34 is kept at ground potential since the second input 50 is grounded. Accordingly, the potential on the first electrode 34 is determined by the potential on the positive input 50 of the operational amplifier 46.

When a time-varying potential is provided to the finger 32 by the drive signal circuitry 47, a corresponding time-varying potential difference occurs between the sensing structure 34 and the finger 32. Due to the capacitive coupling between the finger 32 and the sensing structure 34, the time-varying potential difference is translated into an electronic charge variation on the sensing structure 34 which in turn is transferred to the feedback capacitor 54 resulting in a sensing voltage signal $V_s$ on the output 52 of the charge amplifier 44. The time-varying potential, $V_{DRV}$, may for example be provided to the finger 32 via a bezel (not shown) in the form of an electrically conductive frame arranged around the fingerprint sensing device.

Outside of the sensing element 22, the block diagram in FIG. 3A illustrates readout circuitry 58 which may comprise sample-and-hold circuitry and an analog-to-digital converter for converting one or more analog sensing signals into digital information used to form a digital representation of a fingerprint. The readout circuitry 58 is connected to the output 52 of the charge amplifier 46 to receive and to sample the sensing signal $V_s$.

Further details describing sensing signal readout and subsequent steps to form a fingerprint image from the array 24 of sensing elements are well known in the field of capacitive fingerprint sensing.

Figure 3B:
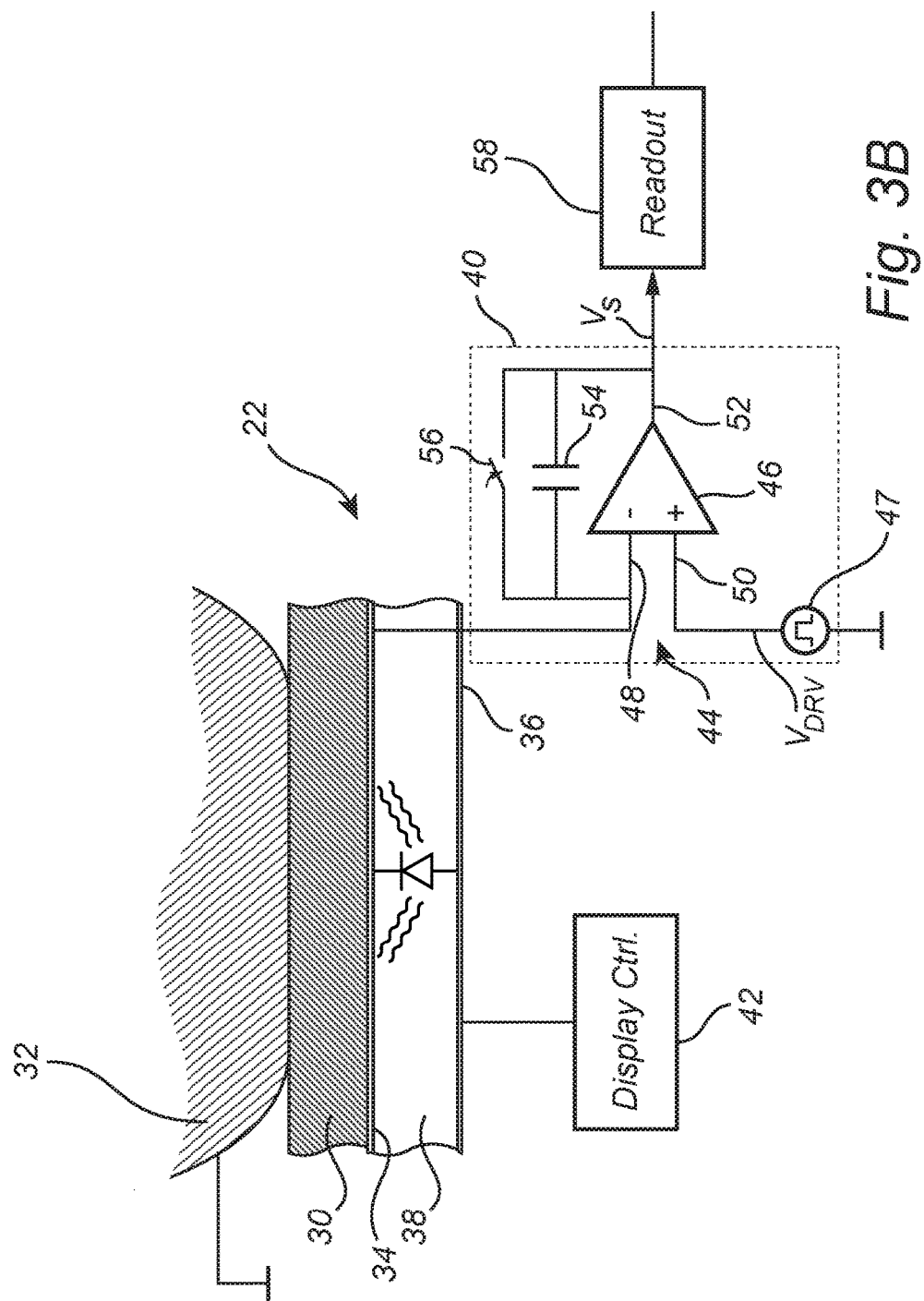

FIG. 3B schematically illustrates a capacitive fingerprint sensing device 20 which is largely similar to the device discussed above with reference to FIG. 3A. The difference is that in FIG. 3B, the drive signal circuitry 47 is connected to the second (positive) input 50 of the operational amplifier 46 while the finger 32 is grounded or floating.

As discussed above, the potential of the first input 48 of the operational amplifier 46 substantially follows the potential (i.e. voltage) of the second input 50. Thereby, a drive signal provided by the drive signal circuitry 47 applied to the second input 50 is in effect applied to the first electrode 34, i.e. the sensing structure 34. Thereby, a change in potential difference between the finger 32 and the first electrode 34 is achieved by providing a drive signal to the second input 50 of the operational amplifier 46.

The drive signal circuitry 47 may also be connected to a reference ground potential of the sensing element 22, such that the ground level oscillates according to the drive signal. Thereby, the change in potential difference between the finger 32 and the sensing structure 34 is achieved by providing a drive signal to the reference ground connection such that the ground potential of the sensing device follows the drive signal potential. It is also important to note that the finger 32 does not share the ground connection with the sensing circuitry 40.

Figure 4A:
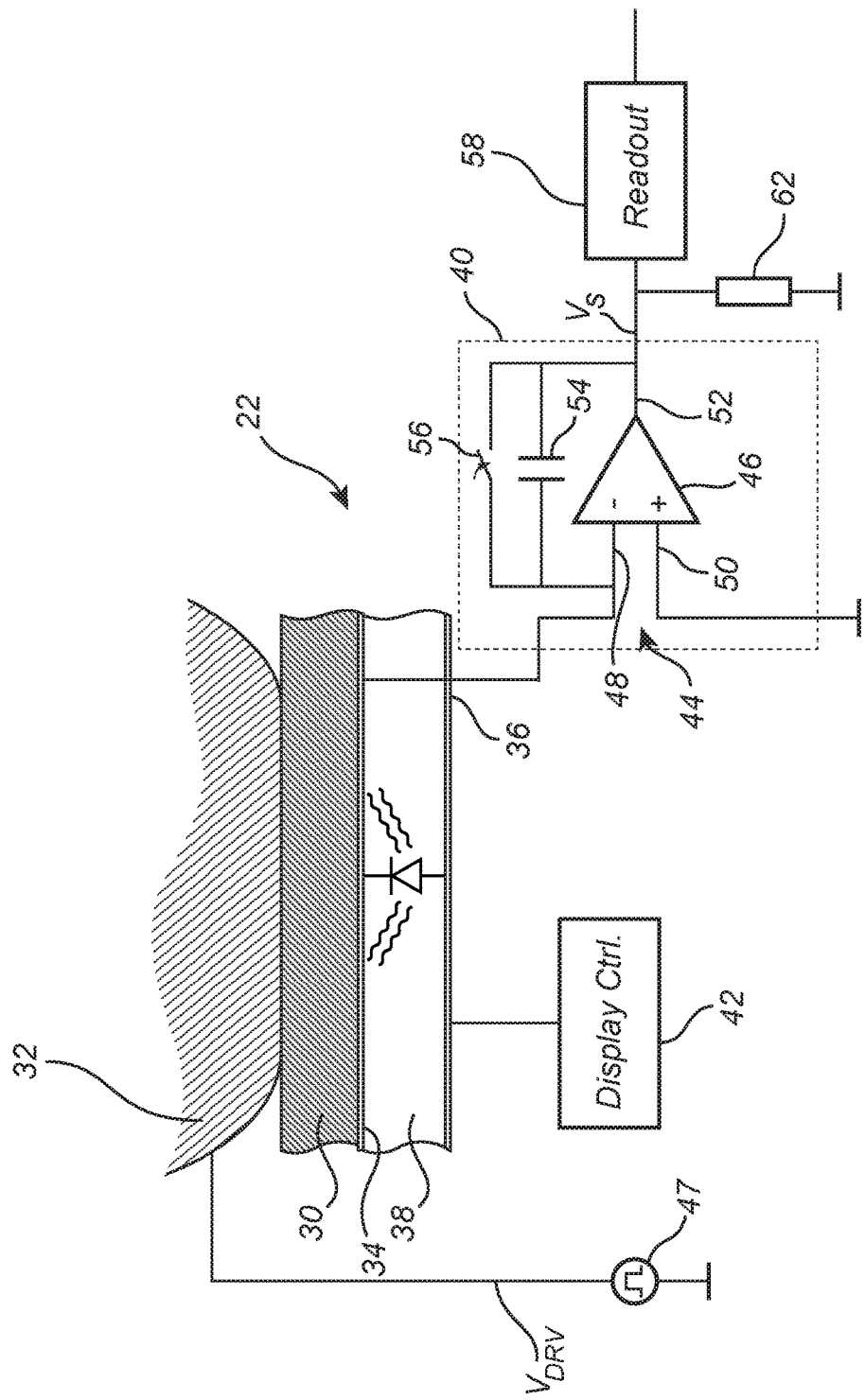
FIGS. 4A-B schematically illustrate sensing elements of a fingerprint sensor according to embodiments of the invention.

FIG. 4A schematically illustrates a sensing device comprising a reference load 62 arranged between the output 52 of the operational amplifier and ground. In the fingerprint sensing mode, the reset switch 56 is opened and closed during different stages of sampling, whereas in the display mode the reset switch 56 is permanently closed in order to bypass the feedback capacitor 54 and to connect the first electrode 34 to the reference load 62 so that a current flowing through the OLED layer 38 in the display mode can be dissipated in the reference load 62. The reference load is selected to have a lower impedance than the input impedance of the operational amplifier 46 and the readout circuitry 58.

Figure 4B:
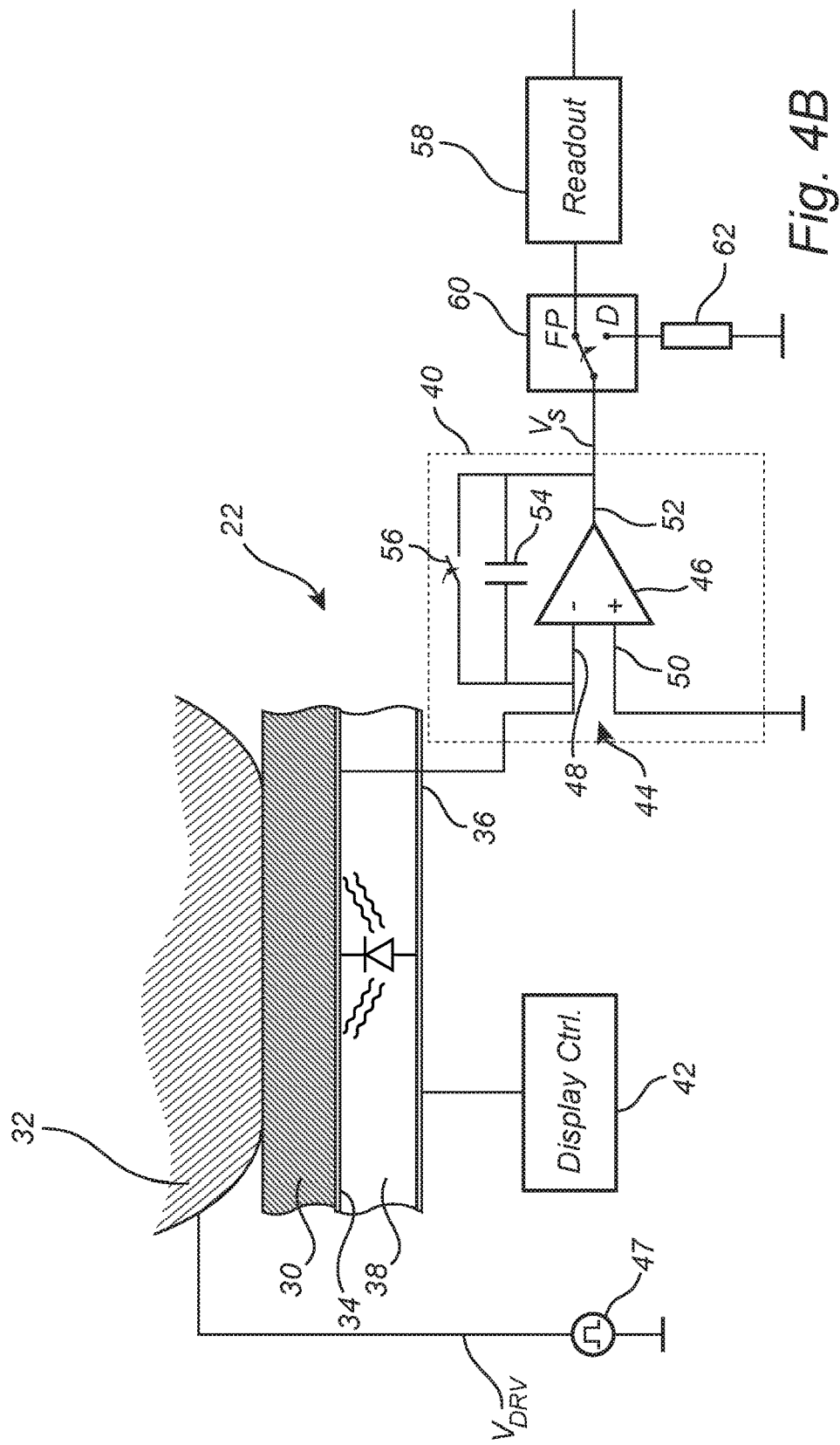

FIG. 4B schematically illustrates a sensing device further comprising an output switch 60 arranged after the output 52 of the operational amplifier 46, to, in the display mode, herein denoted D, connect the output 52 of the operational amplifier 46 to the reference load 62, and in the fingerprint sensing mode, herein denoted FP, connect the output 52 of the operational amplifier 52 to fingerprint readout circuitry 58. Thereby, it is possible to protect the readout circuitry 58 to ensure that no current reaches the readout circuitry 58 in the display mode.

FIG. 5 schematically illustrates a sensing device further comprising an input switch 64 arranged between the first electrode 34 and the first input 48 of the operational amplifier 46, the input switch 64 being configured to, in the display mode D, connect the first electrode 34 to a reference load 62, and in the fingerprint sensing mode FP, connect the first electrode 34 to the first input 48 of the operational amplifier 46.

In FIGS. 4A-B and 5, the drive signal is illustrated as being provided directly to the finger by means of drive signal circuitry 47 providing the drive signal to e.g. a conductive bezel (not shown) which is arranged such that the finger contacts the bezel when the finger is placed on the fingerprint sensor surface. However, the potential difference required for fingerprint sensing may also be achieved in other ways, without using a bezel, e.g. with the drive signal circuitry 47 connected to the second input 50 of the operational amplifier as illustrated in FIG. 3B.

Figure 6:
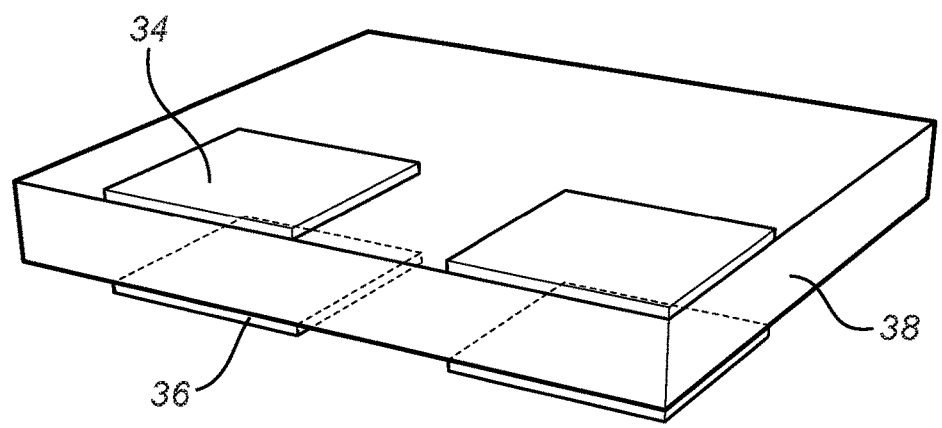
FIG. 6 schematically illustrates sensing elements of a fingerprint sensor according to embodiments of the invention.

FIG. 6 schematically illustrates a portion of a fingerprint sensing device where the plurality of sensing elements are arranged in an array 24, and where the organic light emitting layer 38 is homogeneous in an xy-plane defined by the array. Accordingly, the sensing element 22 here comprises the first electrode 34, the second electrode 36 and the portion of the light emitting layer 38 which is located between the first and second electrodes, 34, 36.

The pixel size is thereby defined by the size of the first and second electrodes 34, 36, and a typical size of a pixel for a fingerprint sensing device is approximately 50×50 μm. However, the pixel size may be varied depending on the desired application. With currently available OLED manufacturing techniques it is possible to produce pixels having a size of a few μm, e.g. 5-10 μm. However, such a high resolution is typically not required for fingerprint sensing.

A homogeneous light emitting layer as described above and illustrated in FIG. 6, which covers all of the second electrodes in the array, may for example simplify manufacturing of the sensing device since there is no need to pattern the light emitting layer 38. However, in the described embodiments with sensing circuitry 40 and readout circuitry 58 located in a substrate below each pixel element, there must still be a connection between the first electrode 34 and the sensing circuitry, i.e. a connection through the light emitting layer 38, such that each first electrode 34 in the sensing array is individually addressable.

Figure 7:
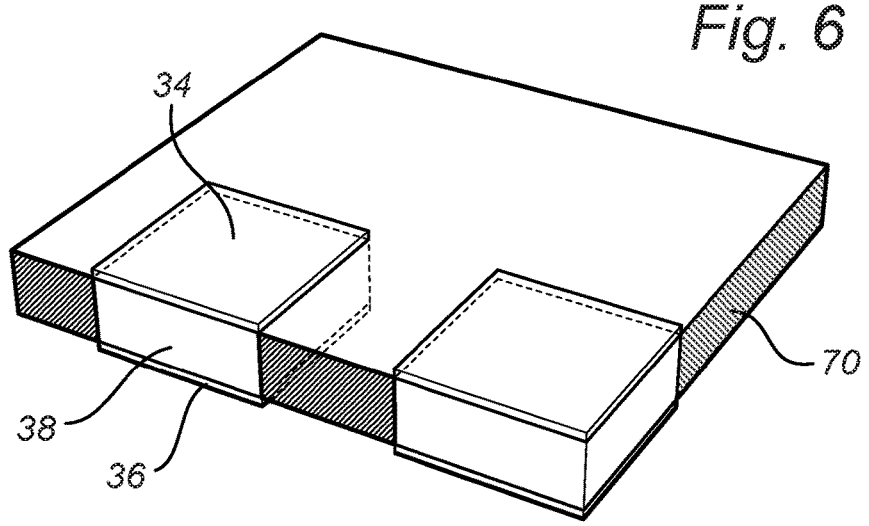
FIG. 7 schematically illustrates sensing elements of a fingerprint sensor according to embodiments of the invention.

FIG. 7 schematically illustrates a portion of a fingerprint sensing device where the plurality of sensing elements 22 are arranged in an array 24, and where the organic light emitting layer 38 comprises individual light emitting areas corresponding to locations of the first and second electrodes 34, 36. A fill material 70 is arranged in the regions between the pixel elements.

It is also possible to form a fingerprint sensing device where the light emitting layer is divided into sections in the xy-plane, where the number of sections may more than one but less than the number of first electrodes.

Figure 8:
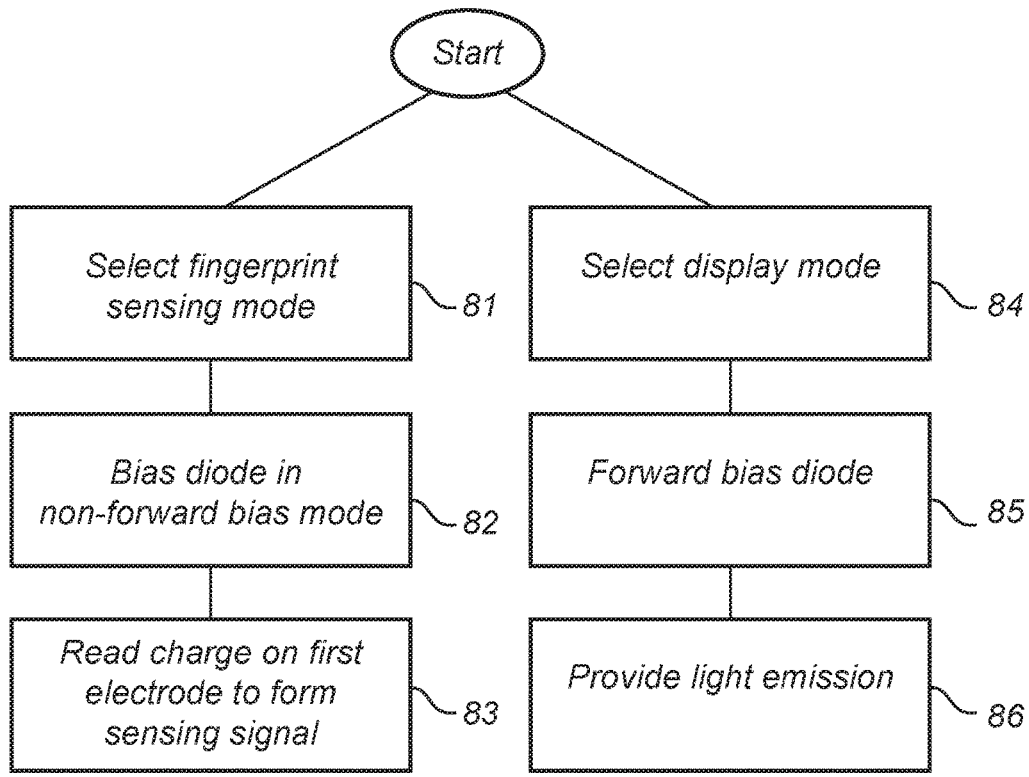
FIG. 8 is a flow chart outlining the general steps of a method according to an embodiment of the invention.

FIG. 8 is a flow chart outlining the general steps of a method according to an embodiment of the invention. First, either a fingerprint sensing mode 81 or a display mode 84 is selected. If the fingerprint sensing mode is selected, a potential is applied to the second electrode 36, and/or to the first electrode 34, such that the diode is reverse biased or biased in sub-threshold region. Next, the sensing circuitry 40 is reading the charge on the first electrode 34 for providing a sensing signal $V_S$ to the readout circuitry 58.

If the display mode 84 is selected, a potential is applied to the second electrode 36, and/or to the first electrode 34, to forward bias the diode such that a current flows through the light emitting layer 38, thereby stimulating light emission 86. Also, the first electrode 34 is preferably connected to a reference load for dissipating the current flowing through the diode.

Figure 9:
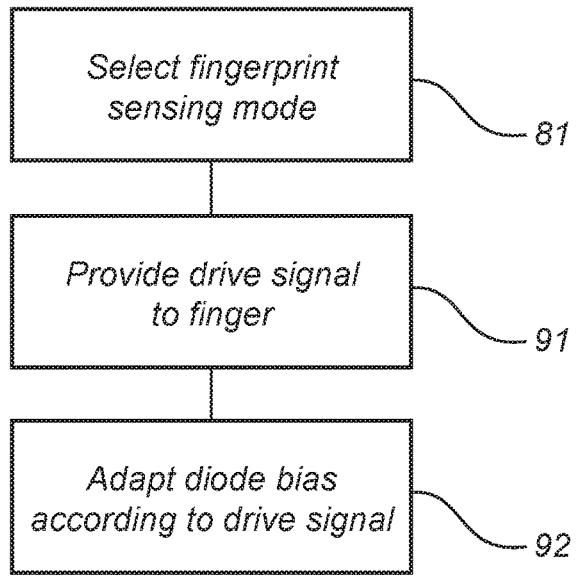
FIG. 9 is a flow chart outlining the general steps of a method according to an embodiment of the invention.

FIG. 9 is a flow chart outlining the general steps of a method according to an embodiment of the invention. The described method is applicable in the fingerprint sensing mode 81, and comprises providing 91 a drive signal for providing a change in potential difference between the finger 32 and the sensing structure 34, i.e. the first electrode. Next, the bias over the diode is adapted 92 based on the drive signal such that the diode remains reverse biased or sub-threshold biased. Adapting a bias over the diode based on the drive signal may comprise applying an additional bias to the second electrode 36 corresponding to the resulting potential on the first electrode 34 originating from the drive signal, to thereby maintain a constant bias between the first and second electrodes 34, 36. It may also be the case that the resulting bias on the first electrode 34 is not known by the display control circuitry 42. In that case, a voltage may be applied on the second electrode 36 to ensure that the diode is either reverse biased or sub-threshold biased, and preferably such that any current flowing between the first electrode 34 and the second electrode 36 is sufficiently small such that the fingerprint sensing operation is not disturbed.

The above described method steps must not be performed in the specific order described above. It is also possible to perform several of the steps simultaneously.

Further features and effects of the described methods are outlined above with reference to the operation of the fingerprint sensing device 20.

Even though the invention has been described with reference to specific exemplifying embodiments thereof, many different alterations, modifications and the like will become apparent for those skilled in the art. Also, it should be noted that parts of the fingerprint sensing device may be omitted, interchanged or arranged in various ways, the sensing device yet being able to perform the functionality of the present invention.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

The invention claimed is:

1. A capacitive fingerprint sensing device for sensing a fingerprint pattern of a finger, said capacitive fingerprint sensing device comprising a plurality of sensing elements, each sensing element comprising:
    a protective dielectric top layer to be touched by said finger;
    a first electrode comprising an optically transparent electrically conductive sensing structure arranged underneath said top layer;
    a second electrode arranged underneath said first electrode;
    an organic light emitting layer arranged between said first and second electrodes;
    fingerprint sensing circuitry connected to said first electrode and configured to provide an analog sensing signal indicative of a distance between said finger and said sensing structure;
    display element control circuitry connected to said second electrode and configured to control a display element comprising said first and second electrodes and said organic light emitting layer; and
    a switching mechanism configured to switch said sensing element between a fingerprint sensing mode and a display mode, wherein said switching mechanism comprises a diode formed by said first and said second electrodes and said organic light emitting layer, and wherein said diode is configured to be forward biased in said display mode such that a current flows from said second electrode to said first electrode through said organic light emitting layer, and to be reverse biased or sub-threshold biased in said fingerprint sensing mode such that the current flowing between said second electrode and said first electrode is sufficiently low so as to allow fingerprint sensing.

2. The device according to claim 1, wherein said fingerprint readout circuitry comprises:
    an operational amplifier having a first input connected to the first electrode of the sensing structure, a second input connected to a reference potential, and an output;
    a feedback capacitor connected between the first input and the output; and
    reset circuitry comprising a reset switch arranged in parallel with the feedback capacitor for allowing controllable discharge of the feedback capacitor, wherein said reset switch is configured to be open at least a portion of the time when said fingerprint sensor is in said fingerprint sensing mode and to be permanently closed in said display mode.

3. The device according to claim 2, further comprising a reference load connected between said output of said operational amplifier and ground.

4. The device according to claim 3, wherein said switching mechanism comprises an output switch arranged after the output of the operational amplifier, to, in said display mode, connect said output of said operational amplifier to said reference load, and in said fingerprint sensing mode, connect said output of said operational amplifier to fingerprint readout circuitry.

5. The device according to claim 2, wherein said switching mechanism comprises an input switch arranged between said first electrode and said first input of said operational amplifier, said input switch being configured to, in said display mode, connect said first electrode to a reference load, and in said fingerprint sensing mode, connect said first electrode to said input of said operational amplifier.

6. The sensing device according to claim 2, wherein said reference potential is a ground potential.

7. The device according to claim 1, wherein said first electrode comprises indium tin oxide, ITO.

8. The sensing device according to claim 1, wherein said fingerprint sensing circuitry and said display element control circuitry is provided in the form of CMOS-circuitry in a Si substrate.

9. The sensing device according to claim 1, wherein said plurality of sensing elements are arranged in an array, and wherein said organic light emitting layer is homogeneous in an xy-plane defined by said array, covering all of said second electrodes in said array.

10. The sensing device according to claim 1, wherein said plurality of sensing elements are arranged in an array, and wherein said organic light emitting layer comprises individual light emitting areas corresponding to locations of said first and second electrodes.

11. The sensing device according to claim 1, further comprising drive signal circuitry configured to, in said fingerprint sensing mode, provide a time varying potential between a finger placed on said sensing surface and said first electrode, wherein said display element control circuitry is configured to adapt a bias over said diode based on said drive signal such that said diode is sub-threshold biased or reverse biased.

12. A method of controlling a capacitive fingerprint sensing device for sensing a fingerprint pattern of a finger, said capacitive fingerprint sensing device comprising a plurality of sensing elements, each sensing element comprising:
a protective dielectric top layer to be touched by said finger;
a first electrode comprising an optically transparent electrically conductive sensing structure arranged underneath said top layer;
fingerprint sensing circuitry connected to said first electrode and configured to provide an analog sensing signal indicative of a distance between said finger and said sensing structure;
a second electrode arranged underneath said first electrode;
an organic light emitting layer arranged between said first and second electrodes;
display element control circuitry connected to said second electrode and configured to control a display element comprising said first and second electrodes and said organic light emitting layer; and
a switching mechanism configured to switch said sensing element between a fingerprint sensing mode and a display mode, wherein said switching mechanism comprises a diode formed by said first and said second electrodes and said organic light emitting layer, and wherein said diode is configured to be forward biased in said display mode such that a current flows from said second electrode to said first electrode through said organic light emitting layer, and to be reverse biased or sub-threshold biased in said fingerprint sensing mode such that the current flowing between said second electrode and said first electrode is sufficiently low so as to allow fingerprint sensing, the method comprising:
controlling said switching mechanism to switch said fingerprint sensing device between a fingerprint sensing mode and a display mode.

13. The method according to claim 12, further comprising, in said display mode, applying a forward bias over said diode comprising said first and second electrode and said organic light emitting layer such that a current flows from said second electrode to said first electrode through said organic light emitting layer, and, in said fingerprint sensing mode, applying a reverse bias or sub-threshold bias over said diode such that the current flowing between said second electrode and said first electrode is sufficiently low so as to allow fingerprint sensing.

14. The method according to claim 12, further comprising, in said fingerprint sensing mode, providing a drive signal for providing a change in potential difference between the finger and the sensing structure, and adapting a bias over said diode based on said drive signal such that said diode remains reverse biased or sub-threshold biased.

15. The method according to claim 14, wherein adapting a bias over said diode based on said drive signal comprises applying a potential to said first electrode and/or to said second electrode corresponding to said drive signal, to minimize the current between said first and second electrodes.

16. The method according to claim 15, wherein adapting a bias over said diode based on said drive signal comprises applying a potential to said first electrode and/or to said second electrode such that the potential is the same on each of said first and second electrodes.

* * * * *